United States Patent [19]

Harnden et al.

[11] Patent Number: 5,017,804
[45] Date of Patent: May 21, 1991

[54] HALL SENSING OF BOND WIRE CURRENT

[75] Inventors: James A. Harnden, Los Gatos; Lorimer K. Hill, Cupertino, both of Calif.

[73] Assignee: Siliconix Incorporated, Santa Clara, Calif.

[21] Appl. No.: 340,445

[22] Filed: Apr. 19, 1989

Related U.S. Application Data

[63] Continuation-in-part of Ser. No. 76,788, Jul. 23, 1987, abandoned.

[51] Int. Cl.⁵ .................. H03K 17/90; H03K 3/26
[52] U.S. Cl. ........................... 307/309; 307/303; 338/32 R
[58] Field of Search ............ 307/309, 278, 303; 338/32 R, 32 H; 324/251, 117 H; 357/27

[56] References Cited

U.S. PATENT DOCUMENTS

| | | | |
|---|---|---|---|
| 3,284,703 | 11/1966 | Brunel | 324/251 |
| 3,296,573 | 1/1967 | Heid et al. | 338/32 R |
| 3,667,000 | 5/1972 | Bergmans | 357/27 |
| 3,693,085 | 9/1972 | Beard | 324/117 H |
| 4,011,469 | 3/1977 | Chapron | 307/278 |
| 4,099,238 | 7/1978 | Suzuki | 364/481 |
| 4,283,643 | 8/1981 | Levin | 307/309 |
| 4,371,837 | 2/1983 | Sieverin | 324/225 |
| 4,553,084 | 11/1985 | Wrathall | 323/316 |
| 4,607,271 | 8/1986 | Popovic et al. | 357/27 |
| 4,616,207 | 11/1986 | Knapp, Jr. et al. | 338/32 |
| 4,625,562 | 12/1986 | Yamashita et al. | 73/728 |
| 4,705,964 | 11/1987 | Higgs | 307/278 |
| 4,760,285 | 7/1988 | Nelson | 307/309 |

FOREIGN PATENT DOCUMENTS 0234578  9/1988  Japan ........................ 338/32 H

OTHER PUBLICATIONS

Baltes and Popovic *Proceedings of the IEEE*, "Integrated Semiconductor Magnetic Field Sensors" (Aug. 1986), pp. 1107–1132.

*Primary Examiner*—Stanley D. Miller
*Assistant Examiner*—Richard Roseen
*Attorney, Agent, or Firm*—Steven F. Caserza

[57]  ABSTRACT

A unique current sense means is provided in which a bonding wire or similar conductor is routed to one or more Hall effect current sensing devices which, in one embodiment, is fabricated as part of a power semiconductor device.

12 Claims, 3 Drawing Sheets

HALL SENSING OF BOND WIRE CURRENT

RELATED APPLICATIONS

This application is a continuation-in-part of U.S. patent application Ser. No. 07/076,788 filed July 23, 1987, now abandoned.

BACKGROUND OF THE INVENTION

This invention pertains to sensing current through a bonding wire, or similar type of conductor, in close proximity to Hall effect devices.

It is often desired to measure current through an electrical circuit. For example, FIG. 1 shows a typical prior art load circuit wherein a switching device, in this example an MOS field effect transistor (MOSFET) 10, is controlled by an input signal applied to terminal 14 for selectively applying a voltage source VCC available on drain 13 of MOSFET 10 to output terminal 12 connected to source 15 of MOSFET 10. In this manner, an external terminal 12 is available for connection to load device 11, which has its other terminal connected to ground. Thus, in response to the input signal applied to control terminal 14 connected to the gate of MOSFET 10, power supply VCC is selectively connected to load device 11. In this example, it is often times helpful to have an indication of the current through load device 11, which is that current through lead 15.

FIG. 2 shows a prior art circuit similar to that of FIG. 1 in which sense resistor 25 is connected in series between source 15 of MOSFET 20 and load terminal 22. In the example of FIG. 2, current through load device 21 can be measured by measuring the voltage drop VS across current sensing resistor 25. Preferably, the resistance RS of sense resistor 25 is made relatively small compared to the resistance RL of load device 21 in order to minimize added voltage drop across sense resistor 25. However, in practice this is difficult and the resistance of current sense resistor 25 may effectively double the voltage drop between supply voltage VCC and load terminal 22, as compared with the voltage drop between those points in a circuit which uses MOSFET 20 without the inclusion of current sense resistor 25. Any additional drop in power supply voltage to load device 21 is undesirable.

Another prior art technique for sensing current in this fashion is described by Wrathall U.S. Pat. No. 4,553,084 which is hereby incorporated by reference. Wrathall in effect provides a switching circuit between a positive supply voltage and a load terminal which includes a first MOSFET, and a second MOSFET connected in series with a current sense resistor. The first MOSFET is made to be rather large and thus has a high current carrying capacity. The second MOSFET is made to be rather small, and thus carries significantly less of the load current. This allows measurement of the load current without adding additional voltage drop due to the inclusion of a current sense resistor.

However, this approach has several drawbacks. For example, for accurate sensing, the device of Wrathall requires a nulling amplifier as a current sensing mechanism, instead of a resistor, because the ratio of currents in the two sources will not be the same as the ratio of the number of cells in the load portion of the device to the number of cells in the sense portion of the device unless the two sources are at the same voltage. Secondly, when the structure of Wrathall is used in a common source configuration (i.e. when the load is connected to the drains, and the source of the load portion of the device is connected to ground), two power supplies are needed in order to establish a current sink for the sense portion of the device and force the two sources to be at the same voltage. In the common drain configuration (i.e. when the drains are connected together to a power supply and the sources are used to source current to the load device) the nulling amplifier must withstand the full common-mode voltage excursion on the load device and, if it is desired to detect a short-circuit load, the nulling amplifier must have a common mode range equal to the power supply voltage. Lastly, the current sense only works when the device is "ON". This limits its usefulness in driving inductive loads which can produce reverse polarity current in the body-drain diode of the device. Sensing the presence and magnitude of this reverse polarity current provides useful information for system control as well as the indication of fault conditions.

These restraints are rather limiting making design of a circuit as described by Wrathall difficult, bulky, and expensive.

SUMMARY OF THE INVENTION

In accordance with the teachings of this invention, a unique current sense means is provided in which a bonding wire used to connect a semiconductor device to an external terminal is routed to a Hall effect current sensing device which, in one embodiment, is fabricated as part of the aforementioned semiconductor device.

DETAILED DESCRIPTION

Figure 1:
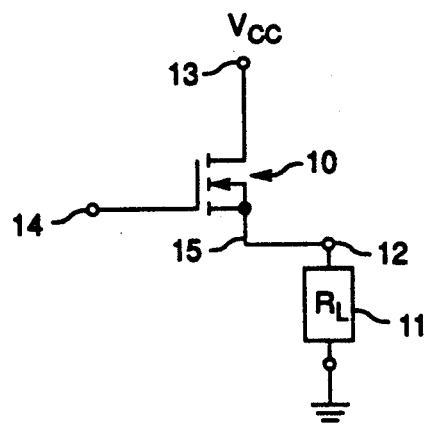
FIG. 1 is a schematic diagram of a prior art circuit including a current switching transistor and a load device.
Figure 2:
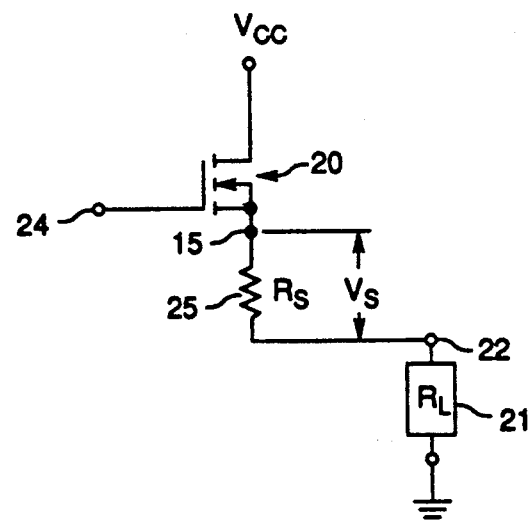
FIG. 2 is a schematic diagram of a prior art circuit including a current sensing resistor.
Figure 3:
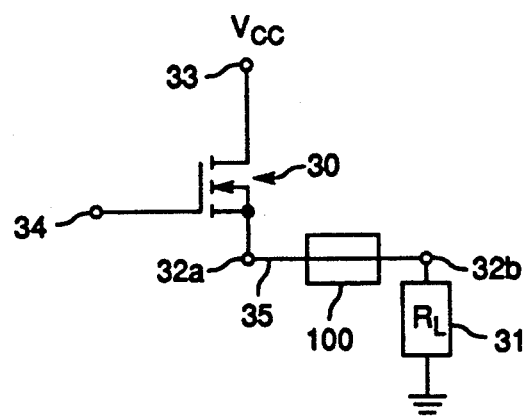
FIG. 3 is a schematic diagram of one embodiment of this invention.

In accordance with the teachings of this invention, a unique current sensing mechanism is provided. Rather than, as taught in the prior art, using a current sensing resistor either in the primary or a secondary current path to the load device, in accordance with the teachings of this invention, a Hall effect device is used to measure the load current. FIG. 3 shows a schematic diagram of one embodiment of this invention in which MOS switching transistor 30 is shown having a control gate 34, its drain connected to a positive voltage supply VCC, and its source connected to terminal 32a. Load device 31 is shown having one terminal connected to ground, and the second terminal connected to terminal 32b. Connected between terminals 32a and 32b is wire 35, for example a bonding wire commonly used in semiconductor applications. Bonding wire 35 is formed to serve as an element of Hall effect current sense device 100. Placement of bonding wire 35 in close proximity to the Hall sense device is essential to obtaining the maximum sensitivity, since load current between terminals 32a and 32b along wire 35 establishes a magnetic field that decreases in intensity as the distance from wire 35 increases. At a specific distance from wire 35, the strength of the magnetic field is directly proportional to the magnitude of the current in wire 35, and thus Hall effect device 100 provides an indication of the strength of the magnetic field and thus the magnitude of the current through wire 35. Polarity of the magnetic field is determined by the direction of current in wire 35. Thus, Hall effect device 100 also provides an indication of the direction of current through wire 35.

Figure 4:
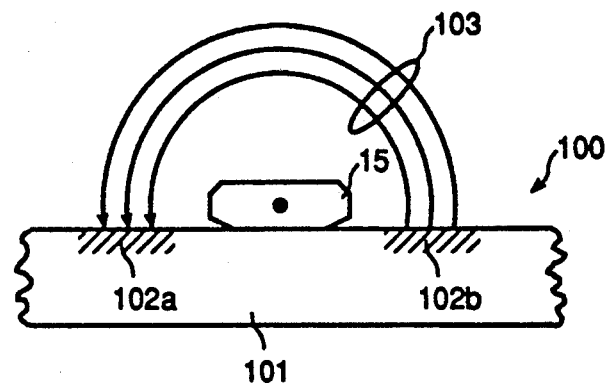
FIG. 4 is a cross-sectional view of one embodiment of the present invention.

FIG. 4 is a cross-sectional view of one embodiment of Hall effect current sensing device 100 of FIG. 3. Hall effect current sensing device 100 includes Hall effect sensors 102a and 102b located within a semiconductor substrate 101. Attached or at least placed in close proximity to semiconductor substrate 101 between Hall effect sensors 102a and 102b is wire 15. The dot contained in wire 15 indicates that current flow through wire 15 is out of the page, and thus magnetic flux lines are generated from Hall sensor 102a to Hall sensor 102b, as shown.

Figure 5:
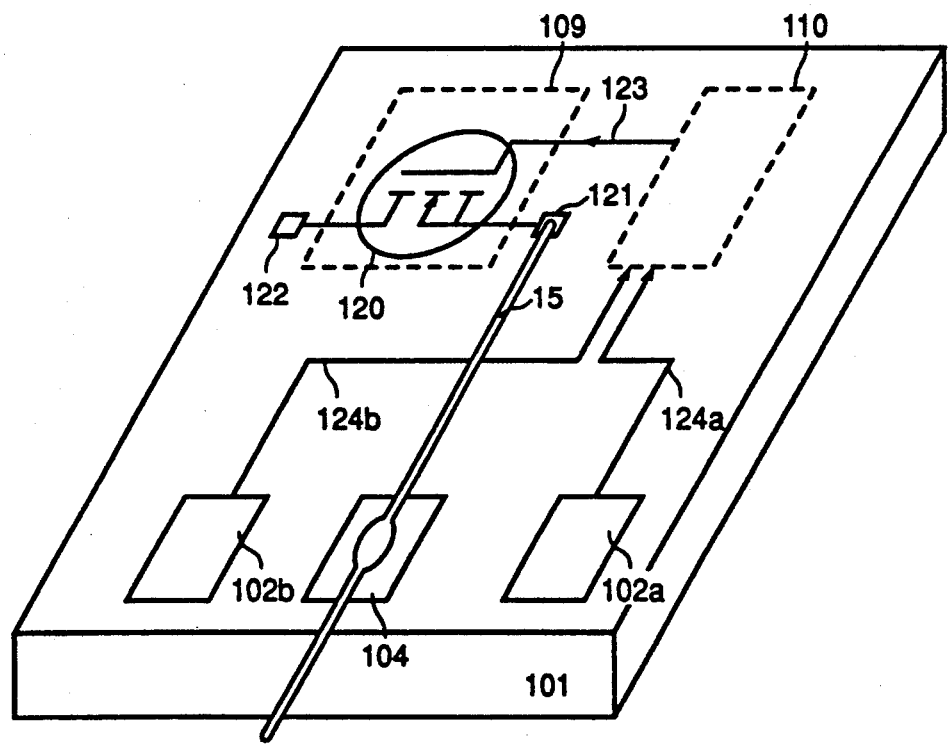
FIG. 5 is a three dimensional view of one embodiment of this invention.

FIG. 5 shows another view of the structure of FIG. 4. Shown in FIG. 5 is bonding pad 104 which is formed on substrate 101 in order to bond wire 15 to hold it in place, as desired. Naturally, if desired, a suitable insulation layer (not shown) is formed under wire 15 (FIG. 4) or under bonding pad 104 (FIG. 5).

If desired, it is convenient to fabricate a load current switching device 120, such as MOSFET 30 of FIG. 3, on the same piece of semiconductor material as Hall effect device 100. As shown in the embodiment of FIG. 5, switching device 120 is a MOSFET fabricated in active area 109 having its drain connected to bonding pad 122 for connection to an external load. Its source is connected to bonding pad 121 for the attachment of one end of wire 15 which is held in place on bonding pad 104 between Hall effect sensors 102a and 102b. Substrate 101 also includes active area 110 which contains suitable electronic circuitry for translating, if desired, the Hall effect current sensing device output signal for use, for example, as a feedback signal to control the magnitude of the load current. As shown in FIG. 5, Hall effect sensors 102a and 102b provide their output signals via leads 124a and 124b to electronic control circuitry contained within active region 110. This electronic control circuitry then provides a control signal via lead 123 to the gate of MOSFET 120. A more detailed description of one embodiment of control circuitry such as formed within active region 110 is described later with reference to FIG. 7.

In accordance with the teachings of this invention, a load current structure, including a current sensing means, is provided which is easily fabricated using well known semiconductor principals. A detailed description of structure and operation of Hall effect devices is provided in "Integrated Semiconductor Magnetic Field Sensors," Baltes and Popovic, proceedings of the IEEE, Volume 74, No. 8, August 1968, pages 1107-1132, which is hereby incorporated by reference.

In accordance with the teachings of this invention the following benefits are realized. First, the common-mode voltage of the Hall effect sensors is fixed and independent of power supply voltage and load voltage transients. This significantly reduces settling time of the current sensing signal in response to transients in the load current. Also, the use of a wire in order to form a portion of the current sensing device does not appreciably increase the voltage drop across the combination of the load current switching device and load current sensor. Furthermore, since the magnetic field is inversely proportional to the distance from the wire carrying the load current, formation of a Hall effect sensing device in accordance with the teachings of this invention allows for accurate measurement of significantly smaller currents (for example, as low as approximately 10 amperes) as compared with prior art techniques utilizing external sensors which, when packaged, increase the spacing to the current-carrying wire by at least an order of magnitude and decrease the sensitivity accordingly. Furthermore, orientation of a packaged Hall effect sensor with respect to the current carrying wire must be permanently fixed by some means so that the sensitivity does not change because of spacing changes or flux angle changes. Also, the use of two sensors 102a and 102b (FIGS. 4 and 5) allow their output signals to be summed, thereby compensating for dislocations and placement of wire 15 between the two Hall effect sensors. This will greatly ease manufacturing tolerances and allow for relatively high repeatability of current measurements from device to device. Naturally, if desired, a single Hall effect sensing element can be used, for example, either one of Hall effect sensors 102a or 102b of FIGS. 4 and 5. Furthermore, the teachings of this invention is suitable for use with any type of semiconductor current sources and sinks, e.g. MOSFETs, Bipolar transistors, SCRs, Zener diodes, etc, which are, in one embodiment, fabricated in active area 109 of substrate 101 (FIG. 5) together with additional circuitry formed in active area 110 for manipulating the signals received from the Hall effect sensors, for example, to provide feedback to current control devices within active area 109.

It is well known that the intensity of a magnetic field emanating from a current carrying conductor is inversely proportion to the perpendicular distance to the conductor. This is shown for example, in "Fields and Waves In Communication Electronics", second edition, Ramo et al., John Wiley and Sons, 1984, page 74, particularly equation (7) which shows, for a conductor of infinite length $$H = \frac{I}{2\pi r} ; \tag{1}$$

H = magnetic field intensity
I = the current through the conductor; and
r = the perpendicular distance from the conductor.

To show the effect of misplacement of a current carrying conductor with respect to a Hall effect sensor, and to illustrate the use of two sensors at appropriate locations with respect to the current carrying conductor can reduce errors due to misplacement of the conductor with respect to the Hall effect sensors, the following analysis is performed:

Assuming that the voltage output from a Hall sensor is proportional to the magnetic field being sensed, $$V = K1/r, \tag{2}$$

where
K1 = the gain factor, and r = the perpendicular distance from the conductor.

For the current carrying conductor in the plane of two Hall effect sensors, being located on opposite sides of the current carrying conductor, $$Vout = K1(1/r1 + 1/r2); \quad (3)$$

where

Vout = the sum of the voltages from the two Hall effect sensors;
r1 = the perpendicular distance between the conductor and the first Hall effect sensor; and
r2 = the perpendicular distance between the conductor and the second Hall effect sensor.

Set r1 + r2 = a constant = K2. Then $$r2 = K2 - r1 \quad (4)$$

Substituting equation (4) into equation (3), $$Vout = K1(1/r1 + 1/(K2 - r1)) \quad (5)$$

Now set
K1 = 1000, as an arbitrary gain factor.
K2 = 100, as an arbitrary distance between the two Hall effect sensors.

For various values of r1, the following values of Vout are determined.

TABLE 1

| r1 | Scaled Vout (from equation (5)) | (from equation (2)) |
|---|---|---|
| 20 | 62.50 | 50.00 |
| 30 | 47.62 | 33.33 |
| 40 | 41.67 | 25.00 |
| 50 | 40.00 | 20.00 |
| 60 | 41.67 | 16.67 |
| 70 | 47.62 | 14.29 |
| 80 | 62.50 | 12.50 |

Using the values obtained from Table 1, the deviation from the midpoint (r1 = 50) at two possible values of r1 is given:

TABLE 2

| r1 | Deviation from midpoint | |
| | Two Sensors | One sensor |
|---|---|---|
| 30 | 19.05% | 66.67% |
| 70 | 19.05% | −28.75% |

Again, using the values obtained in Table 1, the ratio of the maximum to minimum Vout is as follows:

TABLE 3

| Ratio of maximum to minimum Vout | |
| Two Sensors | One Sensor |
|---|---|
| 1.19 | 2.33 |

Figure 6:
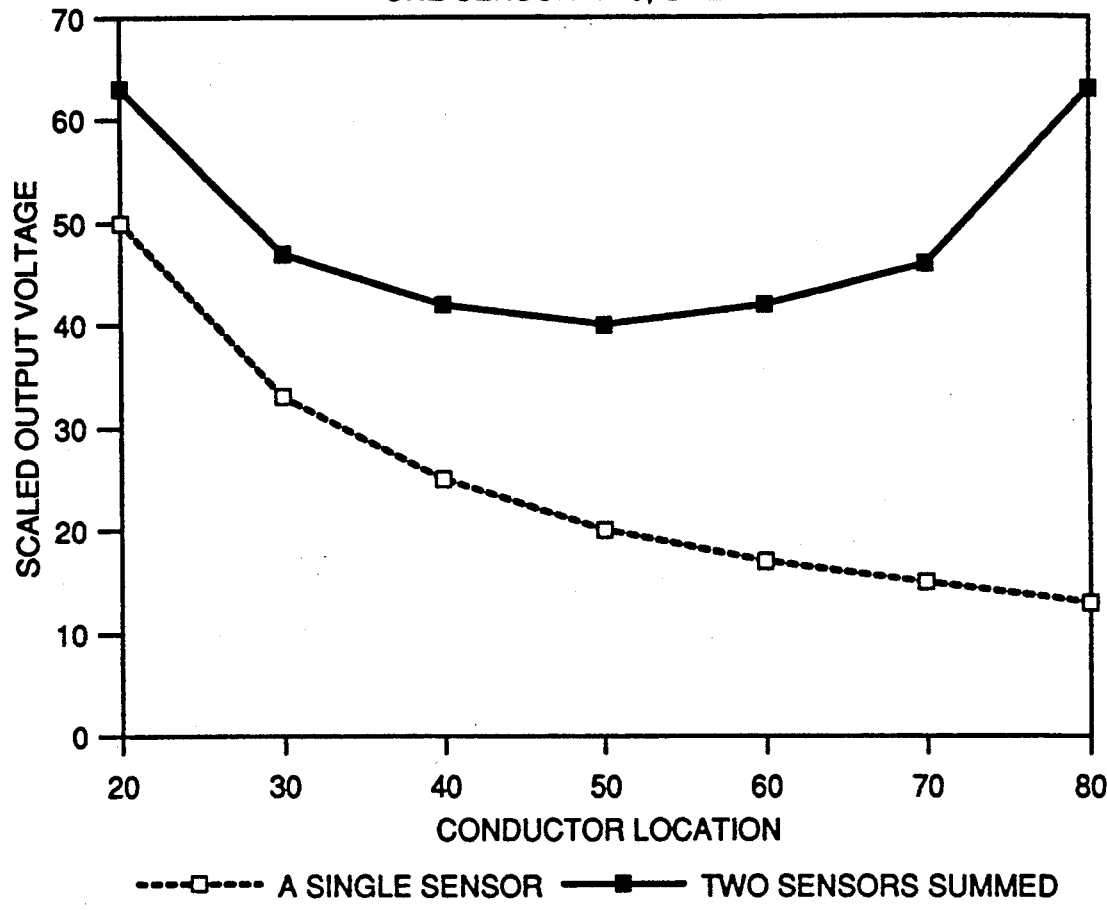
FIG. 6 is a graph depicting the effect on the sensor output signal caused by sensor location with respect to a conductor.

A graph of the values in Table 1 is shown in FIG. 6.

Figure 7:
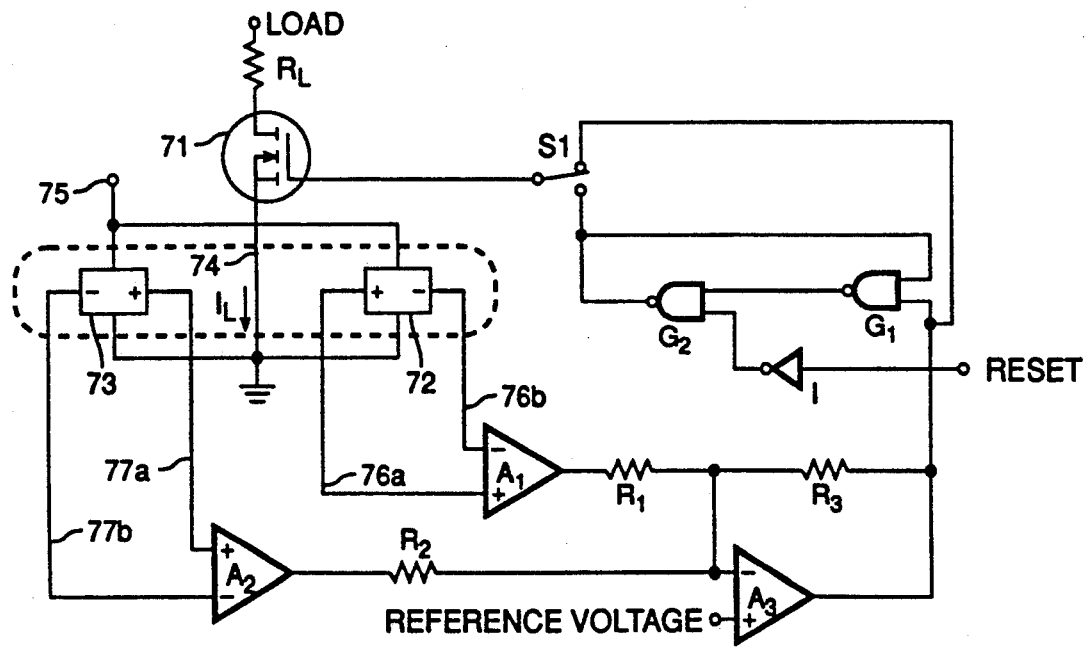
FIG. 7 is a schematic diagram depicting one embodiment of a feedback control circuit constructed in accordance with this invention.

FIG. 7 illustrates one embodiment of this invention where a power MOSFET 71 is controlled by the output signal from two Hall sensors 72 and 73 which measure the intensity of the magnetic field produced by load current $I_L$ flowing through bonding wire 74 from MOSFET 71. Hall sensors 72 and 73 receive a bias voltage from terminal 75 and provide differential output signals on lead pairs 76a, 76b and 77a, 77b which are connected to the non-inverting and inverting input leads of amplifiers A1 and A2, respectively.

Amplifiers A1 and A2 serve two functions. The first is to prevent loading of Hall sensors 72 and 73 and the second is to provide sufficient voltage gain between Hall sensors 72 and 73 and summing resistors R1 and R2. Amplifiers 72 and 73 may be, for example, instrumentation amplifiers. Operational amplifier A3, in conjunction with resistors R1, R2, and R3, sums the output signals of amplifiers A1 and A2. Since the summing function is inverting, the output signal of amplifier A3 ranges between some positive voltage when current $I_L$ through MOSFET 71 is zero to more negative voltages with increasing current $I_L$. For switch S1 in the linear position (switch position as shown in FIG. 7), negative feedback is provided to the gate of MOSFET 71 from the output lead of amplifier A3. In this case, amplifier A3 will attempt to provide gate voltage, and consequently load current $I_L$, which will produce equilibrium for a fixed reference voltage on the noninverting input lead of amplifier A3.

If it is desired to turn off MOSFET 71 when a predetermined load current $I_L$ is reached, the latch composed of NAND gates G1 and G2 is used by putting switch S1 in the latching position (switch position opposite that shown in FIG. 7). For this condition, the reference voltage on the non-inverting input lead of amplifier A3 determines the $I_L$ current level at which the logic threshold of gate G1 will be reached, setting the latch and turning off MOSFET 71. Activation of MOSFET 71 is restored by providing a reset signal through inverter I to gate G2.

All publications and patent applications are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

What is claimed is:

1. A semiconductor device comprising:
   more than one Hall effect sensor; and
   a conductor for carrying current, said conductor being routed in close proximity to said more than one Hall effect sensors and being placed such that any offsets caused by misplacement of said conductor cancel.

2. A device as in claim 1 which further comprises a bonding pad formed on said semiconductor device and located in close proximity to said Hall effect sensors for the routing of said conductor.

3. An electrical circuit comprising:
   a semiconductor current switching element;
   a load device;
   a conductor connected in series with said current switching element and said load device;
   a current sensing means comprising more than one Hall effect devices placed such that any offsets caused by misplacement of said conductor cancel; and
   means for routing said conductor to close proximity of said current sensing means.

4. An electrical circuit as in claim 3 wherein said Hall effect sensors are fabricated in the same semiconductor material as said semiconductor current switching element.

5. An electrical circuit as in claim 3 which further comprises a bonding pad located in close proximity to said Hall effect sensors for the routing of said conductor.

6. An electrical circuit as in claim 3 which further comprises additional circuitry for manipulating the signals received from said current sensing means.

7. An electrical circuit as in claim 3 which further comprises feedback means responsive to said current sensing means for controlling current to said load device.

8. A semiconductor device comprising:
a semiconductor substrate;
one or more Hall effect sensors formed within said semiconductor substrate;
a current controlling element formed in said semiconductor substrate;
a conductor for carrying current flowing through said current controlling element, said conductor being routed in close proximity to said one or more Hall effect sensors, said conductor being placed such that any offsets caused by misplacement of said conductor cancel; and
feedback means for receiving signals from said Hall effect sensors and controlling said current controlling element, thereby adjusting the current flowing through said current controlling element over a range of currents.

9. A device as in claim 8 which further comprises a bonding pad formed on said semiconductor substrate and located in close proximity to said Hall effect sensors for the routing of said conductor.

10. An electrical circuit comprising:
a semiconductor current switching element;
a load device;
a conductor connected in series with said current switching element and said load device;
a current sensing means comprising one or more Hall effect devices placed such that any offsets caused by misplacement of said conductor cancel; and
means for routing said conductor to close proximity of said current sensing means.

11. An electrical circuit as in claim 10 wherein said one or more Hall effect sensors are fabricated in the same semiconductor material as said semiconductor current switching element.

12. An electrical circuit as in claim 10 which further comprises a bonding pad located in close proximity to said one or more Hall effect sensors for the routing of said conductor.

* * * * *

UNITED STATES PATENT AND TRADEMARK OFFICE
CERTIFICATE OF CORRECTION

PATENT NO. : 5,017,804
DATED : May 21, 1991
INVENTOR(S) : Harnden et al.

It is certified that error appears in the above-identified patent and that said Letters Patent is hereby corrected as shown below:

In Figure 4, the designations of Hall Elements 102a and 102b should be reversed.

Column 5, equation 4 should read as follows: $r2 = K2 - r1$.

Signed and Sealed this

Tenth Day of March, 1992

Attest:

HARRY F. MANBECK, JR.

*Attesting Officer*     *Commissioner of Patents and Trademarks*